United States Patent

Imura et al.

[11] Patent Number: 5,910,516
[45] Date of Patent: Jun. 8, 1999

[54] PROCESS FOR PRODUCTION OF PHOTOCHROMIC CURED PRODUCT

[75] Inventors: Satoshi Imura; Toshihiro Nishitake, both of Tokuyama, Japan

[73] Assignee: Tokuyama Corporation, Yamaguchi, Japan

[21] Appl. No.: 08/776,030

[22] PCT Filed: May 24, 1996

[86] PCT No.: PCT/JP96/01384

§ 371 Date: Jan. 23, 1997

§ 102(e) Date: Jan. 23, 1997

[87] PCT Pub. No.: WO96/37573

PCT Pub. Date: Nov. 28, 1996

[30] Foreign Application Priority Data

May 26, 1995 [JP] Japan .................................. 7-128145

[51] Int. Cl.⁶ ...................................... C08F 2/48
[52] U.S. Cl. ................................ 522/39; 522/64; 522/71; 522/75; 522/910; 430/962
[58] Field of Search ...................... 430/19, 962; 252/586; 264/1.1, 1.36; 522/913, 1, 71, 75, 39, 64, 910

[56] References Cited

U.S. PATENT DOCUMENTS 5,531,940 7/1996 Gupta et al. ............................. 264/1.7
5,621,017 4/1997 Kobayakawa et al. .................... 522/16

FOREIGN PATENT DOCUMENTS 4-358117  12/1992  Japan .
7-134356   5/1995  Japan .
7-292011  11/1995  Japan .

*Primary Examiner*—John A. McPherson
*Attorney, Agent, or Firm*—Birch, Stewart, Kolasch & Birch, LLP

[57] ABSTRACT

A photochromic cured product is produced by subjecting a photopolymerizable composition containing (A) a radical-polymerizable monomer, (B) an ultraviolet polymerization initiator having the main absorption in an ultraviolet region and a molar extinction coefficient at 400 nm of 150 lit./(mol·cm) or more, and (C) a photochromic compound, to an irradiation with an active energy ray having, as the main spectrum, an emission spectrum of 400 nm or more, to cure the composition, whereby the polymerization can be performed easily in a short time and a cured product having an excellent photochromic property can be obtained.

15 Claims, No Drawings

PROCESS FOR PRODUCTION OF PHOTOCHROMIC CURED PRODUCT

DESCRIPTION

1. Technical Field

The present invention relates to a process for producing a photochromic cured product having excellent photochromic property, which is a cured product prepared by photopolymerization.

2. Background Art

Photochromism is a phenomenon which has come to draw attention in the last several years, and is such a reversible reaction that a certain compound quickly changes its color when irradiated with an ultraviolet-containing light such as sunlight or a light emitted from a mercury lamp and, when the light irradiation is stopped and the compound is placed in a dark room, returns the original color. Compounds having photochromism are called photochromic compounds, and photochromic compounds having various structures have heretofore been synthesized. In their structures, however, there is found no particular common skeletal structure.

Cured products showing photochromism are obtained by, for example, a process which comprises coating the above-mentioned photochromic compound on the surface of a pre-molded polymer, or a process which comprises dissolving the photochromic compound in a radical-polymerizable monomer and then subjecting the resulting solution to polymerization to cure.

As a process for polymerizing a radical-polymerizable monomer, there are generally known a thermal polymerization process and a photopolymerization process. When the photopolymerization process is used in obtaining a cured product having photochromic property, however, sufficient polymerization of a radical-polymerizable monomer can not be expected from the reasons that the photochromic compound contained in the polymerizable composition absorbs an ultraviolet light necessary for the cleavage of a polymerization initiator and that the color development of the photochromic compound by itself by light irradiation hinders the transmittance of light. Further, according to the study by the present inventors, in the case of employing a photopolymerization process, durability in photochromism of the photochromic compound is remarkably reduced when the photochromic compound is dispersed in a matrix polymer of insufficient degree of polymerization.

From such standpoints, in obtaining a photochromic cured product, the thermal polymerization process is in general use for polymerization of a radical-polymerizable monomer. The thermal polymerization process, however, requires a polymerization time of several hours and is still not satisfactory in productivity of the cured products.

Given the above background, the present invention aims at providing a process which allows easy polymerization in a short time by photopolymerization and can produce a cured product of excellent photochromic property.

DISCLOSURE OF THE INVENTION

In view of the above problem, the present inventors made an extensive study. As a result, the present inventors found that molding can be made easily in a short time and a cured product can show excellent photochromism by using, in combination, a specific photopolymerization initiator and an active energy ray having a specified emission spectrum. The present invention has been accomplished based on this finding.

That is, the present invention provides a process for producing a photochromic cured product, which comprises subjecting a photopolymerizable composition comprising (A) a radical-polymerizable monomer, (B) an ultraviolet polymerization initiator having the main absorption in an ultraviolet region and a molar extinction coefficient at 400 nm of 150 lit./(mol·cm) or more, and (C) a photochromic compound, to an irradiation with an active energy ray having, as the main spectrum, an emission spectrum of 400 nm or more, to cure the composition.

As the radical-polymerizable monomer used in the present process for production of a photochromic cured product, there can be used any monomer having a radical-polymerizable group without restriction. The radical-polymerizable group is preferably selected from an acrylate group, a methacrylate group, a vinyl group and the like.

Typical examples of the radical-polymerizable monomer preferably usable in the present invention include compounds represented by the following general formula (1), (2) or (3):

A diacrylate or dimethacrylate compound represented by the following formula (1)

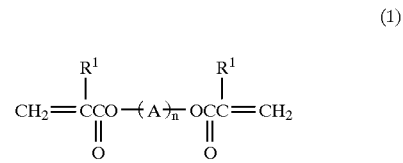

[wherein two $R^1$s may be the same or different and are each a hydrogen atom or a methyl group; one or more A(s) may be the same or different and are each a substituted or unsubstituted alkylene group, a substituted or unsubstituted oxyalkylene group or a group represented by the following formula:

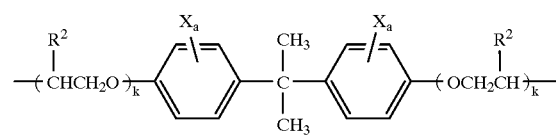

(in which $R^2$ is a hydrogen atom or a methyl group; X is a halogen atom; k is an integer of 0 to 5; and a indicates the number of halogen atoms as substituents and is an integer of 0 to 4); and n is an integer of 1 to 20];

An epoxy group-containing acrylate or methacrylate compound represented by the following formula (2)

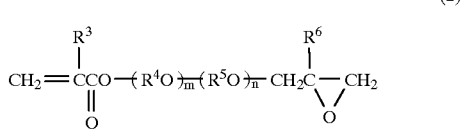

(wherein $R^3$ and $R^6$ may be the same or different and are each a hydrogen atom or a methyl group; $R^4$ and $R^5$ may be the same or different and are each a substituted or unsubstituted alkylene group or a group represented by the following formula:

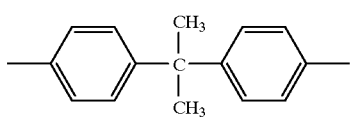

and m and n are each 0 or 1); and

A vinylbenzyl compound represented by the following formula (3)

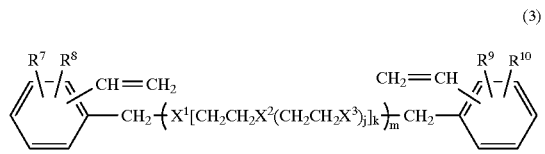

(3)

(wherein $R^7$, $R^8$, $R^9$ and $R^{10}$ may be the same or different and are each a halogen atom; $X^1$, $X^2$ and $X^3$ are each an oxygen atom or a sulfur atom; j, k and m are each 0 or 1 with a proviso that when k=0, j=0; when m=0, k=j=0; and when j=k=m=1, all of $X^1$, $X^2$ and $X^3$ are not sulfur atoms simultaneously).

Specific examples of the radical-polymerizable monomer preferably usable in the present invention are as follows.

The diacrylate or dimethacrylate compounds include, for example, diethylene glycol dimethacrylate, triethylene glycol dimethacrylate, tetraethylene glycol dimethacrylate, butanediol dimethacrylate, hexamethylene dimethacrylate, bisphenol A dimethacrylate, 2,2-bis(4-methacryloyloxyethoxy-3,5-dibromophenyl)propane, 2,2-bis(4-methacryloyloxyethoxyphenylpropane, 2,2-bis(4-methacryloyloxydiethoxyphenylpropane, 2,2-bis(4-methacryloyloxytriethoxyphenylpropane, and 2,2-bis(4-methacryloyloxypentaethoxyphenylpropane.

The epoxy group-containing acrylate or methacrylate compounds include, for example, glycidyl acrylate, glycidyl methacrylate, β-methylglycidyl acrylate, β-methylglycidyl methacrylate and bisphenol A monoglycidyl ether methacylate.

The vinylbenzyl compounds include, for example, bis-4-vinylbenzyl ether, bis-4-vinylbenzyl sulfide, 1,2-(p-vinylbenzyloxy)ethane, 1,2-(p-vinylbenzylthio)ethane and bis-(p-vinylbenzyloxyethyl) sulfide.

In addition, as the radical-polymerizable monomer, there can also be used an unsaturated carboxylic acid, an acrylic or methacrylic acid ester, a fumaric acid ester and an aromatic vinyl compound. The unsaturated carboxylic acid includes, for example, acrylic acid, methacrylic acid, maleic anhydride, fumaric acid and acrylic acid. The methacrylic acid ester includes, for example, methyl acrylate, methyl methacrylate, benzyl methacrylate, phenyl methacrylate, tribromophenyl methacrylate, 2-hydroxyethyl methacrylate, trifluoromethyl methacrylate and urethane acrylate. The fumaric acid ester includes, for example, monomethyl fumarate, diethyl furmarate and diphenyl fumarate. The aromatic vinyl compound includes, for example, styrene, chlorostyrene, α-methylstyrene, vinylnaphthalene, isopropenyl naphthalene, bromostyrene and divinylbenzene. These radical-polymerizable monomers may be used singly or in admixture of two or more.

Of the above radical-polymerizable monomers, use of a radical-polymerizable mixture of a diacrylate or dimethacrylate compound represented by the general formula (1) with an epoxy group-containing acrylate or methacrylate compound represented by the general formula (2) is preferred in view of physical properties, such as durability in photochromism, color developing-color bleaching properties or the like, of the cured product obtained by photopolymerizing a mixture of a radical-polymerizable monomer and a photochromic compound described later.

In the present invention, it is requisite to use an ultraviolet polymerization initiator having the main absorption in an ultraviolet region and a molar extinction coefficient at 400 nm of 150 lit./(mol·cm) or more. Use of a photopolymerization initiator having the main absorption in a visible light region of 400 nm or more is not preferable because such a photopolymerization initiator itself has a color and, as a result, the cured product obtained has a color before it exhibits photochromism. Further, when an ultraviolet polymerization initiator having the main absorption in an ultraviolet region but having a molar extinction coefficient at 400 nm of less than 150 lit./(mol·cm) is used, cleavage of the photopolymerization initiator hardly takes place by irradiation with an active energy ray having, as the main absorption, an emission spectrum of 400 nm or more (described later)and hence, it is difficult to obtain a cured product in a short time. In other words, generally, since a photochromic compound absorbs an ultraviolet light ranging from 380 to 400 nm thereby to develops a color, the photochromic compound absorbs an active energy ray which is necessary for the cleavage of photopolymerization initiator, making the cleavage difficult to occur and making the completion of polymerization in a short time impossible. Irradiation with an active energy ray for long time for completion of polymerization results in deterioration of photochromic compound.

Ultraviolet polymerization initiators are roughly classified into a direct photo-fragmentation type and a bimolecular hydrogen transfer type. An ultraviolet polymerization initiator of the latter type is generally used in combination with a photosensitizer. An amine compound is generally used as the photosensitizer. When an amine compound is used, the resulting polymer has coloring and hence, the ultraviolet polymerization initiator of a direct photofragmentation type is preferably used. Of the ultraviolet polymerization initiators of the direct photofragmentation type, α-aminoalkylphenone based ultraviolet polymerization initiators, acylphosphine oxide based ultraviolet polymerization initiators and bisacylphosphine oxide based ultraviolet polymerization initiators are preferably employed because they give a colorless and transparent cured product.

There is no particular restriction as to the preferable ultraviolet polymerization initiators, but typical examples thereof include compounds represented by the following formula (4), (5) or (6). α-Aminoalkylphenone based compounds represented by the following formula (4):

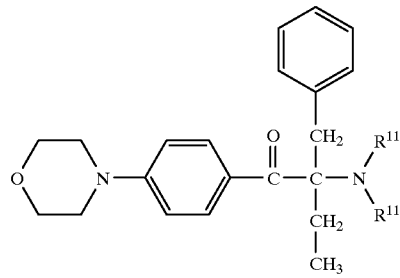

(4)

(wherein a plurality of $R^{11}$s may be the same or different and are each a methyl group or an ethyl group). Acylphosphine oxide based compounds represented by the following formula (5):

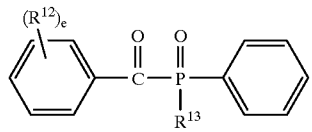

(5)

(wherein a plurality of $R^{12}$s may be the same or different and are each a methyl group, a methoxy group or a chlorine atom; e is 2 or 3; and $R^{13}$ is a phenyl group or a methoxy group). Bisacylphosphine oxide based compounds represented by the following formula (6):

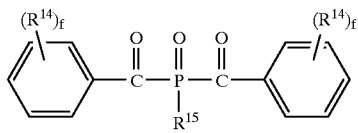

(6)

(wherein a plurality of $R^{14}$s may be the same or different and are each a methyl group, a methoxy group or a chlorine atom; f is 2 or 3; and $R^{15}$ is a 2,4,4-trimethylpentyl group).

Below mentioned are specific examples of the preferably used ultraviolet polymerization initiator having the main absorption in an ultraviolet region and a molar extinction coefficient at 400 nm of 150 lit./(mol·cm) or more.

α-Aminoalkylphenone based photopolymerization initiators
(1) 2-Benzyl-2-dimethylamino-1-(4-morpholinophenyl)-butanone-1

Acylphosphine oxide based photopolymerization initiators:
(1) 2,6-Dimethylbenzoyldiphenylphosphine oxide
(2) 2,4,6-Trimethylbenzoyldiphenylphosphine oxide
(3) 2,6-Dichlorobenzoyldiphenylphosphine oxide
(4) 2,6-Dimethoxybenzoyldiphenylphosphine oxide Bisacylphosphine oxide based photopolymerization initiators
(1) Bis(2,6-dimethoxybenzoyl)-2,4,4-trimethylpentylphosphine oxide
(2) Bis(2,6-Dimethylbenzoyl)-2,4,4-trimethylpentylphosphine oxide
(3) Bis(2,4,6-trimethylbenzoyl)-2,4,4-trimethylpentylphosphine oxide
(4) Bis(2,6-dichlorobenzoyl)-2,4,4-trimethylpentylphosphine oxide These ultraviolet polymerization initiators can be used singly or in combination of two or more.

The amount of the ultraviolet polymerization initiator used differs depending upon the conditions of polymerization, the kind of initiator, and the kind and composition of radical-polymerizable monomer(s) and cannot be specified generally. It is generally, however, 0.01 to 1 part by weight, preferably 0.05 to 1 part by weight, per 100 parts by weight of the radical-polymerizable monomer. When the amount is more than 1 part by weight, the resulting polymer is inferior in uniformity of the inside and tint. When the amount is less than 0.01 part by weight, the resulting polymer can not have sufficient hardness.

Further, it is possible to use a thermal polymerization initiator in addition to the ultraviolet polymerization initiator. The thermal polymerization initiator used may be any known thermal polymerization initiator. It includes diacyl peroxides such as benzoyl peroxide, lauroyl peroxide and the like; peroxy esters such as t-butyl peroxyneodecanoate and the like; percarbonates such as diisopropyl peroxydicarbonate and the like; azo compounds such as azobisisobutyronitrile and the like; and so forth.

The photochromic compound contained in the photopolymerizable composition of the present invention may be any known photochromic compound as long as it has an absorption in a visible light region. The absorption in the visible light region is specifically shown below. Photochromic compounds showing absorption property in a range of around 400 to 480 nm develop a yellow to orange color; photochromic compounds showing absorption property in a range of around 480 to 550 nm develop a red to purple color; and photochromic compounds showing absorption property in a range of around 550 to 600 nm develop a purple to blue color. These photochromic compounds may be used singly but, when used in combination of two or more, can develop a neutral color such as gray, brown, amber or the like.

The photochromic compound preferably used in the present invention is selected from chromene compounds, fulgide or fulgimide compounds and spirooxazine compounds.

As the chromene compounds, any known compounds having a chromene skeleton and a photochromic property can be used without restriction. Specific examples thereof are as follows.

Chromene compounds
(1) 2,2-Diphenyl-7-octoxy(2H)benzo(f)chromene
(2) Spiro(bicyclo[3.3.1]nonane-9,2'-(2H)benzo(h)chromene)
(3) Spiro(norbornane-2,2'-(2H)benzo(h)chromene)
(4) 7'-Methoxyspiro(bicyclo[3.3.1]nonane-9,2'-(2H)benzo(h)chromene)
(5) 7'-Methoxyspiro(norbornane-2,2'-(2H)benzo(h)chromene)
(6) 2,2-Dimethyl-7-octoxy(2H)benzo(f)chromene The fulgide compounds may be any known compounds having a fulgide skeleton and a photochromic property. Specific examples thereof are as follows.

Fulgide compounds
(1) N-Methyl-6,7-dihydro-4-methylspiro(5,6-benzo[b]thiophenedicarboxyimido-7,2-tricyclo[3.3.1.1]decane
(2) N-Cyanomethyl-6,7-dihydro-4-methyl-2-phenylspiro(5,6-benzo[b]thiophenedicarboxyimido-7,2-tricyclo[3.3.1.1]decane
(3) N-Cyanomethyl-6,7-dihydro-4-methyl-2(p-methoxyphenyl)spiro(5,6-benzo[b]thiophenedicarboxyimido-7,2-tricyclo[3.3.1.1]decane
(4) N-Cyanomethyl-6,7-dihydro-4-methylspiro(5,6-benzo[b]thiophenedicarboxyimido-7,2-tricyclo [3.3.1.1]decane
(5) N-Cyanomethyl-6,7-dihydro-4-cyclopropyl-spiro(5,6-benzo[b]thiophenedicarboxyimido-7,2-tricyclo[3.3.1.1]decane
(6) 6,7-Dihydro-N-methoxycarbonylmethyl-4-methyl-2-phenylspiro(5,6-benzo[b]thiophenedicarboxyimido-7,2-tricyclo[3.3.1.1]decane As the spirooxazine compounds, any known compounds having a spirooxazine skeleton and a photochromic property can be used without restriction. Specific examples thereof are as follows.

Spirooxazine compounds
(1) 1,3,3-Trimethyl-spiro(indole-2,3-[3,2-a][1,4]naphthooxazine
(2) 1,3,3-Trimethyl-6'-piperidino-spiro(indole-2,3-[3,2-a][1,4]naphthooxazine
(3) 6-Fluoro-1'-methyl-8"-methoxy-6"-morpholinodispiro(cyclohexane-1,3'-(3H)indole-2'-(2'H),3"-(3H)naphtho(3,2-a)(1,4)oxazine)

(4) 1'-Methoxycarbonylmethyl-8"-methoxy-6"-(4-methylpiperazino)dispiro(cyclohexane-1,3'-(3H)indole-2'-(2'H),3"-(3H)naphtho(3,2-a)(1,4) oxazine)

(5) 1'-(2-Dioxazine-2-yl)ethyl)-6"-morpholinodispiro (cyclohexane-1,3'-(3H)indole-2'-(2'H),3"-(3H)naphtho(3,2-a)(1,4)oxazine)

(6) 5-Fluoro-1'-methyl-6"-piperidinodispiro(cyclohexane-1,3'-(3H)indole-2'-(2'H),3"-(3H)naphtho(3,2-a)(1,4) oxazine)

(7) 8"-Methoxydispiro(cyclohexane-1,3'-(3H)indole-2'-(2'H),3"-(3H)naphtho(2,3-a)(1,4)oxazine)

The amount of the photochromic compound used can be appropriately determined depending upon the desired density of developed color, but is generally 0.001 to 1.0 part by weight, preferably 0.01 to 0.5 part by weight, per 100 parts by weight of the radical-polymerizable monomer. When the amount of the photochromic compound used is less than 0.001 part by weight, no sufficient density of developed color can be obtained and, moreover, the resulting cured product has low durability in photochromism. When the amount exceeds 1.0 part by weight, the polymerization is difficult to complete in a short time and hence, such an amount is not preferable.

The photopolymerizable composition of the present invention can contain, as necessary, various stabilizers and additives such as a mold-releasing agent, an ultraviolet absorber, an ultraviolet stabilizer, an antioxidant, a coloring inhibitor, an antistatic agent, a fluorescent dye, a dye, a pigment, an odorant or the like.

The light source used in the photopolymerization of the present invention may be any light source capable of emitting an active energy ray having, as the main spectrum, an emission spectrum of 400 nm or more, i.e. a light having, as the main spectrum, a spectrum of visible light region. The light source can be selected from, for example, a metal halide lamp, a medium-pressure mercury lamp, a high-pressure mercury lamp, an ultrahigh-pressure mercury lamp, a germicidal lamp, a xenon lamp, a tungsten lamp or the like. When a lamp capable of emitting both a visible light and an ultraviolet light, such as metal halide lamp, high-pressure mercury lamp or the like is used, the active energy ray in ultraviolet region must be screened or reduced by the use of an ultra-violet-eliminating filter or the like.

In general, photochromic compounds absorb an ultraviolet light of 380 to 400 nm and develop a color and consequently, the photochromic compound after color development absorbs an active energy ray necessary for cleavage of photopolmerization initiator, making the cleavage difficult and making the completion of polymerization in a short time impossible. Long-time irradiation with active energy ray for completion of polymerization results in deterioration of the photochromic compound. When the light source used emits a light accompanied by an ultraviolet light, the color development of photochromic compound can be suppressed by screening or reducing an active energy ray of ultraviolet region through an ultraviolet-eliminating filter or the like; thus, even a light source emitting a light containing an ultraviolet region can be used. In actual curing operation, complete elimination of spectrum of shorter than 400 nm is not necessary and the active energy ray used may partly contain an active energy ray of ultraviolet region (shorter than 400 nm) as long as the ray has, as the main spectrum, an emission spectrum of 400 nm or more. In this case, although the photochromic compound used develops a color weakly and absorbs partly the active energy ray of ultraviolet region, the active energy ray of 400 nm or more can transmit substantially and can give rise to cleavage of the ultraviolet polymerization initiator, making possible sufficient polymerization to cure.

The irradiation time varies depending upon the wavelength and intensity of light source used and the shape and constituents of cured product obtained; therefore, it is desired to be determined beforehand by preliminary test or the like.

In photopolymerization, at least the surface of the mold to which a light is applied, must be transparent, and the surface is generally made of a material such as glass or the like. In particular, a material capable of transmitting an ultraviolet light easily, such as quartz or the like is preferably employed, while the material is not particularly restricted as long as it is transparent. In the molding, polymerization may be conducted while an external pressure is applied.

The production process of the present invention can be conducted by a known cast polymerization. Typically, it can be conducted by pouring a photopolymerizable composition in a mold held by an elastomer gasket or a spacer, irradiating the composition with the above-mentioned active energy ray to cure the composition, and taking the cured product out of the mold.

The photochromic cured product obtained as above can be subjected to the following treatments, depending upon the application. That is, to the cured product can be applied processing and secondary treatments such as dyeing by the use of a dye such as disperse dye or the like; a treatment by a silane coupling agent or a hard-coat agent containing, as the main component, a sol component of silicon, zirconium, antimony, aluminum, tin, tungsten or the like; an anti-reflection treatment by formation of a thin film of a metal oxide (e.g. $SiO_2$, $TiO_2$ or $ZrO_2$) by vapor deposition, or an antistatic treatment by formation of a thin film of an organic polymer by coating; and so forth.

According to the production process by photopolymerization of the invention, there can be produced in a short time a photochromic cured product which is free from deterioration of photochromic compound, which develops a color of high density and which has a sufficient hardness. The cured product, when irradiated with an ultraviolet-containing light such as sunlight, light from mercury lamp or the like, changes from a colorless state to a colored state; the change is reversible; and the photochromic performance is excellent. Therefore, the cured product is useful as an organic lens having photochromism, and can be suitably used, for example, in applications such as photochromic lens.

EXAMPLES

The present invention is hereinafter described by way of Examples, but is not intended to be restricted to these Examples. In the Examples, "part" refers to "part by weight".

The following radical-polymerizable monomers were used in the Examples.

M1: 2,2-Bis(4-methacryloyloxyethoxyphenylpropane
M2: 2,2-Bis(4-methacryloyloxydiethoxyphenylpropane
M3: 2,2-Bis(4-methacryloyloxypentaethoxyphenylpropane
M4: Bisphenol A monoglycidyl ether methacrylate
M5: Triethylene glycol dimethacrylate
M6: Tetraethylene glycol dimethacrylate
M7: Hexamethylene dimethacrylate
M8: Glycidyl methacrylate
M9: 2-Hydroxyethyl methacrylate M10: Methyl Methacrylate M11: Isobornyl acrylate M12: Pentaerythrithol triacrylate hexamethylenediisocyanate urethane prepolymer.

The following photochromic compounds were used.

C1: 2,2-Diphenyl-7-octoxy(2H)benzo(f)chromene

C2: Spiro(bicyclo[3.3.1]nonane-9,2'-(2H)benzo(h)chromene).

The following fulgide compounds were used.

F1: N-Methyl-6,7-dihydro-4-methylspiro(5,6-benzo[b]-thiophenedicarboxyimido-7,2-tricyclo[3.3.1.1]decane F2: N-Cyanomethyl-6,7-dihydro-4-methyl-2-phenylspiro-(5,6-benzo[b]thiophenedicarboxyimido-7,2-tricyclo-[3.3.1.1]decane.

The following spirooxazine compounds were used.

S1: 1,3,3-Trimethyl-spiro(indole-2,3-[3,2-a][1,4]-naphthooxazine

S2: 1,3,3-Trimethyl-6'-piperidino-spiro(indole-2,3-[3,2-a][1,4]naphthooxazine

The following photopolymerization initiators were used. The figure in the parenthesis []refers to a molar extinction coefficient [lit./(mol·cm)]at 400 nm.

I1: CGI-1700 [trade name, a product of Ciba-Geigy (Japan) Limited], which is a 1:3 mixture of bis(2,6-dimethoxybenzoyl)-2,4,4-trimethylpentylphosphine oxide [550]and 2-hydroxy-2-methyl-1-phenyl-propane-1-one [10 or less]

I2: 2,4,6-Trimethylbenzoyldiphenylphosphine oxide [250]

I3: 2-Benzyl-2-dimethylamino-1-(4-morpholinophenyl)-butanone-1[200]

I4: Methylbenzoyl formate [10 or less]

Example 1

90 Parts of 2,2-bis(4-methacryloyloxydiethoxyphenyl propane, 10 parts of glycidyl methacrylate, an amount shown in Table 1 of a photochromic compound(s) shown in Table 1, and an amount shown in Table 1 of a photopolymerization initiator shown in Table 1 were sufficiently mixed. The resulting mixture was poured into a mold constituted by a glass sheet and a gasket composed of an ethylene-vinyl acetate copolymer. The mold was irradiated with a light from a metal halide lamp (output: 120 W/cm) for 15 minutes through an ultraviolet-eliminating filter capable of screening an active energy ray of 380 nm by 99%, 390 nm by 98%, 400 nm by 50% and 410 nm by 15%, which was placed between the metal halide lamp and the mold, in order to apply an active energy ray of substantially 400 nm or more. After the completion of polymerization, the resulting polymer was taken out of the glass mold.

[Curability]

The curability of the obtained cured product (thickness: 2 mm) was examined by comparing the hardness of the polymer with that of a polymer obtained by the photopolymerization under the same conditions except that no photochromic compound was added. The curability of the former polymer was rated according to the following standard.

(○): About the same hardness (100 to 90%) as that of the polymer obtained from a polymer containing no photochromic compound.

(Δ): 90 to 50% of the hardness of the polymer obtained using no photochromic compound.

(X): 50% or less of the hardness of the polymer obtained using no photochromic compound.

[Color developability]

The color developability of the obtained polymer was evaluated as follows. The polymer was irradiated with a beam emitted from a xenon lamp [L-2480 (300 W) SHL-100, a product of Hamamatsu Photonics Co., Ltd.]through Aero Mass Filter (a product of Corning Co., Ltd.) at 20°±1° C. at a beam density on the polymer surface of 2.4 mW/cm$^2$ (365 nm) for 30 seconds and 24 mW/cm$^2$ (245 nm) for 30 seconds to give rise to color development. The absorbance of the colored polymer at its maximum absorption wavelength was evaluated based on its proportion (%) to the absorbance after color development of a polymer which was obtained by pouring, into the same mold, the same mixture except that 1.0 part of a thermal polymerization initiator (t-butyl peroxydecanoate) was used in place of the above photopolymerization initiator, placing the mold in an air oven, elevating the temperature gradually from 30° C. to 90° C. over 18 hours, and keeping the temperature of 90° C. for 2 hours. The color developability of the obtained polymer was rated according to the following standard.

(○): The proportion of absorbance is larger than 80%.

(Δ): The proportion of absorbance is 80 to 50%.

(X): The proportion of absorbance is smaller than 50%.

Further, the polymer was placed under a sunlight for 10 minutes and examined its developed color visually. The results are shown in Table 1.

TABLE 1

|  | Chromene compound No. | Fulgide or fulgimide compound No. | Spirooxazine compound No. | Initiator | Filter | Curability | Color developability | Developed color |
|---|---|---|---|---|---|---|---|---|
| Ex. 1 | C1 (0.04) | — | — | I2 (0.1) | Used | ○ | ○ | Yellow |
|  | — | F1 (0.04) | — | I1 (0.2) | Used | ○ | ○ | Red |
|  | C1 (0.04) | — | S2 (0.02) | I3 (0.2) | Used | ○ | ○ | Gray |
|  | C1 (0.10) | F2 (0.03) | — | I1 (0.2) | Used | ○ | ○ | Brown |
|  | C2 (0.15) | — | S1 (0.20) | I1 (0.4) | Used | ○ | ○ | Brown |
|  | C2 (0.07) | F1 (0.07) | — | I2 (0.1) | Used | ○ | ○ | Brown |
| Comp. Ex. 1 | C1 (0.04) | — | — | I4 (0.1) | Used | X | — | — |

TABLE 1-continued

|  | Chromene compound No. | Fulgide or fulgimide compound No. | Spirooxazine compound No. | Initiator | Filter | Curability | Color developability | Developed color |
|---|---|---|---|---|---|---|---|---|
| Comp. Ex. 2 | C1 (0.04) | — | — | I4 (0.1) | Not used | X | — | — |
| Comp. Ex. 3 | — | F1 (0.01) | — | I1 (0.2) | Not used | ○ | X | Red |

Ex.: Example
Comp. Ex.: Comparative Example

Example 2

The same procedure was conducted except that the kinds of the photochromic compounds and the radical-polymerizable monomers used in Example 1 were changed. The results are shown in Table 2.

TABLE 2

|  | Radical monomer Nos. | Chromene compound No. | Fulgide or compound No. | Spirooxazine compound No. | Initiator | Curability | Color developability | Developed color |
|---|---|---|---|---|---|---|---|---|
| Ex. 2 | M1:(50) M3:(40) M8:(10) | C1 (0.10) | F2 (0.05) | — | I1 (0.2) | ○ | ○ | Gray |
|  | M5:(40) M6:(40) M12:(10) M8:(10) | C1 (0.20) | — | S2 (0.08) | I1 (0.2) | ○ | ○ | Brown |
|  | M1:(40) M6:(55) M9:(5) | C1 (0.15) | F2 (0.08) | — | I1 (0.2) | ○ | ○ | Gray |
|  | M4:(20) M6:(50) M10:(20) M8:(10) | C2 (0.05) | — | S2 (0.05) | I1 (0.2) | ○ | ○ | Gray |
|  | M1:(60) M11:(30) M8:(10) | C2 (0.10) | F2 (0.07) | — | I2 (0.1) | ○ | ○ | Brown |
|  | M5:(60) M7:(15) M2:(20) M8:(5) | C1 (0.15) | — | S2 (0.08) | I2 (0.1) | ○ | ○ | Gray |

Ex.: Example

Comparative Example 1

The same procedure was conducted in the same manner as in Example 1 except that methylbenzoyl formate was used as the photopolymerization initiator. The results are shown in Table 1.

Comparative Example 2

The same procedure was conducted in the same manner as in Example 1 except that methylbenzoyl formate was used as the photopolymerization initiator and no ultraviolet-eliminating filter was used. The results are shown in Table 1.

Comparative Example 3

The same procedure was conducted in the same manner as in Example 1 except that no ultraviolet-eliminating filter was used. The results are shown in Table 1.

We claim:

1. A process for producing a photochromic cured product, which comprises subjecting a photopolymerizable composition containing (A) a radical-polymerizable monomer, (B) an ultraviolet polymerization initiator having the main absorption in an ultraviolet region and a molar extinction coefficient at 400 nm of 150 lit./(mol·cm) or more, and (C) a photochromic compound, to an irradiation with an active energy ray having, as the main spectrum, an emission spectrum of 400 nm or more, to cure the composition, wherein the irradiation with an active energy ray is conducted through a filter capable of eliminating an ultraviolet light having a wavelength of shorter than 400 nm.

2. The process according to claim 1, wherein the radical-polymerizable monomer (A) is at least one compound selected from the group consisting of diacrylate or dimethacrylate compounds represented by the following formula (1):

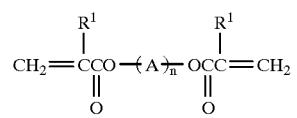

(1)

wherein two $R^1$s may be the same or different and are each a hydrogen atom or a methyl group; one or more A(s) may be the same or different and are each a substituted or unsubstituted alkylene group, a substituted or unsubstituted oxyalkylene group or a group represented by the following formula:

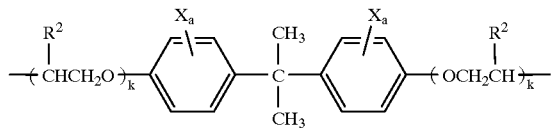

in which $R^2$ is a hydrogen atom or a methyl group; X is a halogen atom; k is an integer of 0 to 5; and a indicates the number of halogen atoms as substituents and is an integer of 0 to 4; and n is an integer of 1 to 20;

epoxy group-containing acrylate or methacrylate compounds represented by the following formula (2):

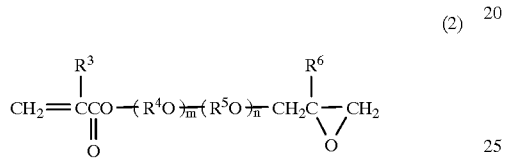

(2)

wherein $R^3$ and $R^6$ may be the same or different and are each a hydrogen atom or a methyl group; $R^4$ and $R^5$ may be the same or different and are each a substituted or unsubstituted alkylene group or a group represented by the following formula:

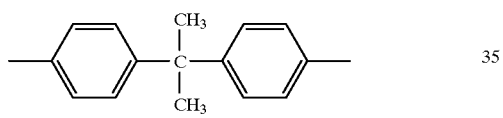

and m and n are each 0 or 1; and vinylbenzyl compounds represented by the following formula (3):

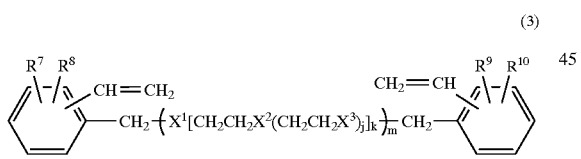

(3)

wherein $R^7$, $R^8$, $R^9$ and $R^{10}$ may be the same or different and are each a halogen atom; $X^1$, $X^2$ and $X^3$ are each an oxygen atom or a sulfur atom; j, k and m are each 0 or 1 with a proviso that when k=0, j=0; when m=0, k=j=0; and when j=k=m=1, all of $X^1$, $X^2$ and $X^3$ are not sulfur atoms simultaneously.

3. The process according to claim 2, wherein the diacrylate or dimethacrylate compounds are selected from the group consisting of diethylene glycol dimethacrylate, triethylene glycol dimethacrylate, tetraethylene glycol dimethacrylate, butanediol dimethacrylate, hexamethylene dimethacrylate, bisphenol A dimethacrylate, 2,2-bis(4-methacryloyloxyethoxy-3,5-dibromophenyl)propane, 2,2-bis(4-methacryloyloxyethoxyphenylpropane, 2,2-bis(4-methacryloyloxydiethoxyphenylpropane, 2,2-bis(4-methacryloyloxytriethoxyphenylpropane, and 2,2-bis(4-methacryloyloxypentaethoxyphenylpropane.

4. The process according to claim 2, wherein the epoxy group containing acrylate or methacrylate compounds are selected from the group consisting of glycidyl acrylate, glycidyl methacrylate, β-methylglycidyl acrylate, β-methylglycidyl methacrylate and bisphenol A monoglycidyl ether methacrylate.

5. The process according to claim 2, wherein the vinylbenzyl compounds are selected from the group consisting of bis-4-vinylbenzyl ether, bis-4-vinylbenzyl sulfide, 1,2-(p-vinylbenzyloxy)ethane, 1,2-(p-vinylbenzylthio)ethane and bis-(p-vinylbenzyloxyethyl) sulfide.

6. The process according to claim 1, wherein the ultraviolet polymerization initiator (B) is at least one compound selected from the group consisting of compounds represented by the following formula (4):

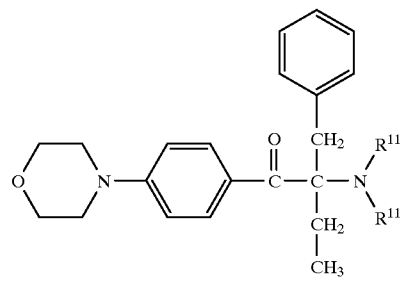

(4)

wherein a plurality of $R^{11}$S may be the same or different and are each a methyl group or an ethyl group;

compounds represented by the following formula (5):

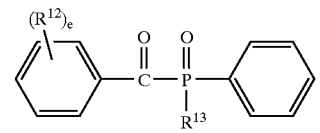

(5)

wherein a plurality of $R^{12}$S may be the same or different and are each a methyl group, a methoxy group or a chlorine atom; e is 2 or 3; and $R^{13}$ is a phenyl group or a methoxy group; and compounds represented by the following formula (6):

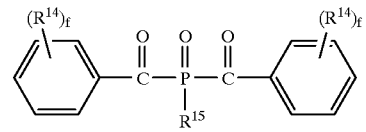

(6)

wherein a plurality of $R^{14}$S may be the same or different and are each a methyl group, a methoxy group or a chlorine atom; f is 2 or 3; and $R^{15}$ is a 2,4,4-trimethylpentyl group.

7. The process according to claim 1, wherein the ultraviolet polymerization initiator (B) is used in an amount of 0.01 to 1 part by weight per 100 parts by weight of the radical-polymerizable monomer (A).

8. The process according to claim 1, wherein the photochromic compound (C) is selected from the group consisting of chromene compounds, fulgide compounds, fulgimide compounds and spirooxazine compounds.

9. A process according to claim 1, wherein the photochromic compound (C) is used in an amount of 0.001 to 1.0 part by weight per 100 parts by weight of the radical-polymerizable monomer (A).

10. The process according to claim 1, wherein the radical-polymerizable monomer is selected from the group consisting of an unsaturated carboxylic acid, an acrylic acid ester, a methacrylic acid ester, a fumaric acid ester and an aromatic vinyl compound.

11. The process according to claim 10, wherein the unsaturated carboxylic acid is selected from the group consisting of acrylic acid, methacrylic acid, maleic anhydride, fumaric acid and acrylic acid.

12. The process according to claim 10, wherein the methacrylic acid ester is selected from the group consisting of methyl acrylate, methyl methacrylate, benzyl methacrylate, phenyl methacrylate, tribromophenyl methacrylate, 2-hydroxyethyl methacrylate, trifluoromethyl methacrylate and urethane acrylate.

13. The process according to claim 10, wherein the fumaric acid ester is selected from the group consisting of monomethyl fumarate, diethyl furmarate and diphenyl fumarate.

14. The process according to claim 10, wherein the aromatic vinyl compound is selected from the group consisting of styrene, chlorostyrene, α-methylstyrene, vinylnaphthalene, isopropenylnaphthalene, bromostyrene and divinylbenzene.

15. The process according to claim 1, wherein irradiation is for about 15 minutes.

* * * * *